(12) United States Patent
Kwon et al.

(10) Patent No.: US 10,505,067 B2
(45) Date of Patent: Dec. 10, 2019

(54) AQUEOUS DISPERSION COMPOSITION, BACK SHEET FOR AN ECO-FRIENDLY PHOTOVOLTAIC MODULE, AND METHOD FOR MANUFACTURING SAME

(71) Applicant: LG CHEM, LTD., Seoul (KR)

(72) Inventors: Yoon Kyung Kwon, Daejeon (KR); Hyun Cheol Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 160 days.

(21) Appl. No.: 14/274,425

(22) Filed: May 9, 2014

(65) Prior Publication Data

US 2014/0246085 A1  Sep. 4, 2014

Related U.S. Application Data

(63) Continuation of application No. PCT/KR2012/009616, filed on Nov. 14, 2012.

(30) Foreign Application Priority Data

Nov. 17, 2011 (KR) .................. 10-2011-0120192
Nov. 14, 2012 (KR) .................. 10-2012-0128897

(51) Int. Cl.
*H01L 31/18* (2006.01)
*C08J 5/18* (2006.01)
(Continued)

(52) U.S. Cl.
CPC .............. *H01L 31/18* (2013.01); *C08J 5/18* (2013.01); *H01L 31/049* (2014.12);
(Continued)

(58) Field of Classification Search
CPC ... C08J 5/18; C08J 2300/102; H01L 31/0487; H01L 31/049; H01L 31/18; C08K 2003/2241; Y02E 10/50
See application file for complete search history.

(56) References Cited

U.S. PATENT DOCUMENTS 6,124,045 A *  9/2000  Soda ............... C09D 127/12
                                                        428/500
2004/0068046 A1*  4/2004  Hugo ............... C09D 5/00
                                                        524/556
(Continued)

FOREIGN PATENT DOCUMENTS

CN  1643405 A  7/2005
EP  0526797 A1 *  2/1993 ............ C08J 3/12
(Continued)

OTHER PUBLICATIONS

KR 10-2011-0040739 Machine Translation.*

*Primary Examiner* — Travis M Figg
(74) *Attorney, Agent, or Firm* — Dentons US LLP

(57) ABSTRACT

Provided are an aqueous dispersion composition, a backsheet for a photovoltaic module, a method of preparing the same, and a photovoltaic module. Since the aqueous dispersion composition includes a fluorine-based polymer, a pigment and an aqueous dispersion binder, a backsheet for a photovoltaic module using the aqueous dispersion composition is prepared without a toxic organic solvent, and thus is environmentally friendly and economical. In addition, as the aqueous dispersion binder is used, a chalking phenomenon in which the pigment projected on a surface of the backsheet is easily detached may be prevented, thereby enhancing both productivity and quality.

17 Claims, 2 Drawing Sheets

(51) Int. Cl.
*H01L 31/049* (2014.01)
*C08K 3/22* (2006.01)

(52) U.S. Cl.
CPC . *C08J 2300/102* (2013.01); *C08K 2003/2241* (2013.01); *Y02E 10/50* (2013.01)

(56) References Cited

U.S. PATENT DOCUMENTS

| | | | | |
|---|---|---|---|---|
| 2005/0221054 | A1* | 10/2005 | Kawano | G02B 1/105 428/143 |
| 2008/0261037 | A1* | 10/2008 | Snow | B32B 17/10018 428/337 |
| 2009/0221726 | A1* | 9/2009 | Higuchi | C08F 2/22 521/30 |
| 2009/0260677 | A1* | 10/2009 | DeBergalis | C08J 7/047 136/251 |
| 2010/0304270 | A1* | 12/2010 | Amin-Sanayei | H01M 4/0404 429/483 |
| 2011/0020556 | A1* | 1/2011 | Satgurunathan | C08G 18/0823 427/388.4 |
| 2011/0315189 | A1* | 12/2011 | Ge | B32B 7/12 136/244 |
| 2012/0031475 | A1* | 2/2012 | Kim | C09D 127/16 136/252 |
| 2012/0041122 | A1* | 2/2012 | Hidaka | C08J 5/18 524/381 |
| 2012/0073632 | A1* | 3/2012 | Kosar | B32B 17/10018 136/251 |
| 2012/0196971 | A1* | 8/2012 | Saito | C08L 27/16 524/520 |
| 2013/0171447 | A1* | 7/2013 | Kim | H01L 31/0481 428/336 |

FOREIGN PATENT DOCUMENTS

| | | | | | |
|---|---|---|---|---|---|
| EP | 2407490 | A1 | * | 1/2012 | ............ C08F 14/18 |
| EP | 2407490 | A1 | * | 1/2012 | ............ C08F 14/18 |
| KR | 10-2004-0095315 | A | | 11/2004 | |
| KR | 10-2010-0089038 | A | | 8/2010 | |
| KR | 10-2010-0105505 | A | | 9/2010 | |
| KR | 10-2011-0010386 | A | | 2/2011 | |
| KR | 20110010386 | A | * | 2/2011 | |
| KR | 10-2011-0063918 | A | | 6/2011 | |
| KR | 10-2011-0040739 | | * | 11/2011 | |
| KR | 10-2011-0123212 | A | | 11/2011 | |
| WO | 03/083524 | A | | 10/2003 | |
| WO | 2010/101810 | A1 | | 9/2010 | |
| WO | 2010/104142 | A1 | | 9/2010 | |
| WO | 2010/144520 | A1 | | 12/2010 | |
| WO | WO-2010144520 | A1 | * | 12/2010 | ....... B32B 17/10018 |
| WO | WO 2010144520 | A1 | * | 12/2010 | ....... B32B 17/10018 |
| WO | 2011/084438 | A1 | | 7/2011 | |

\* cited by examiner

[FIG. 1]
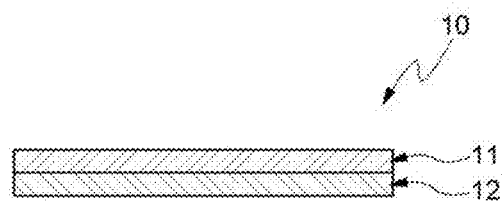
[FIG. 2]
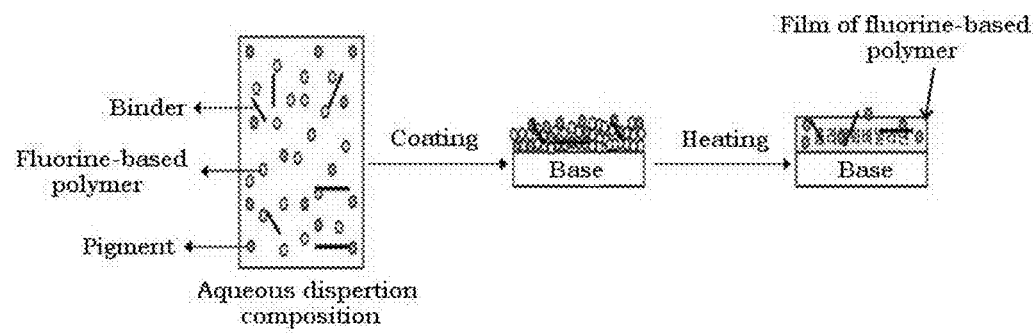
[FIG. 3]
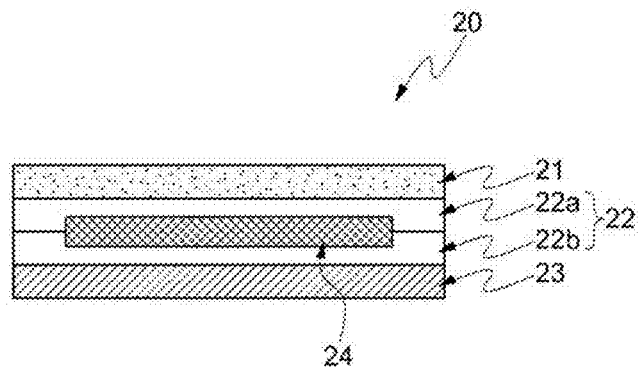

[FIG. 4]
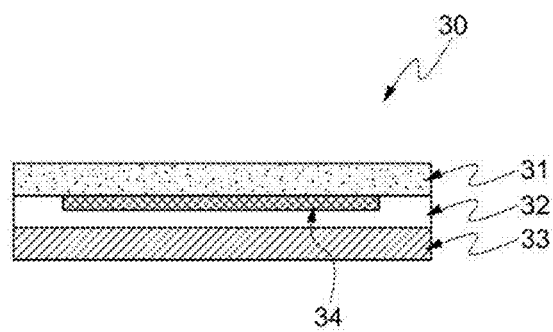

AQUEOUS DISPERSION COMPOSITION, BACK SHEET FOR AN ECO-FRIENDLY PHOTOVOLTAIC MODULE, AND METHOD FOR MANUFACTURING SAME

CROSS-REFERENCE TO RELATED APPLICATION

This application is a Continuation Bypass Application of International Patent Application No. PCT/KR2012/009616, filed Nov. 14, 2012, and claims the benefit of Korean Patent Application No. 10-2011-0120192 filed on Nov. 17, 2011, and Korean Patent Application No. 10-2012-0128897 filed on Nov. 14, 2012, in the Korean Intellectual Property Office, the disclosures of which are incorporated herein by reference.

BACKGROUND

1. Field of the Invention

The present application relates to an aqueous dispersion composition, a backsheet for a photovoltaic module, a method of preparing the same and a photovoltaic module including the same.

2. Discussion of Related Art

Today, attention to new regenerable and clean energy is increasing due to environmental problems of the Earth and the depletion of fossil fuels, and among such energy, solar light energy has attracted attention as a representative non-polluting energy source capable of resolving the problems of environmental pollution and depletion of fossil fuels.

A photovoltaic cell to which a solar power generating principle is applied is a device converting solar light into electric energy, which is exposed to an external environment for a long time to facilitate absorption of the solar light. Therefore, the photovoltaic cell is formed in the form of a unit by performing various packaging to protect the cell, and the unit is called a photovoltaic module.

The photovoltaic module uses a backsheet having excellent weather resistance and durability to stably protect the photovoltaic cell even when exposed to an external environment for a long time of 20 years or more. The backsheet is prepared by stacking a film having durability and weather resistance on one surface of a base.

Generally, as the film having durability and weather resistance used for the backsheet for a photovoltaic module, a fluorine-based film is widely used. However, conventionally, a fluorine-based resin layer formed by processing a fluorine-based resin in a film and adhering the film to a base, or by dissolving a fluorine-based resin using an organic solvent such as dimethylformamide (DMF), dimethylacetamide (DMAC) or N-methylpyrrolidone (NMP), coating the dissolved resin on one surface of a base and volatizing the organic solvent was used.

However, the conventional method has a problem of a poor adhesive strength to the base when processing the film, and a problem of an increase in cost of materials due to the use of the organic solvent in a coating process and environmentally-friendly problems.

SUMMARY OF THE INVENTION

The present application is directed to providing an environmentally-friendly aqueous dispersion composition, particularly, an aqueous dispersion composition for a photovoltaic module having excellent physical properties, a backsheet for a photovoltaic module including the same, a method of preparing the same and a photovoltaic module including the same.

In one aspect, the present application provides an aqueous dispersion composition including a fluorine-based polymer, a pigment and an aqueous dispersion binder.

In another aspect, the present application provides a backsheet for a photovoltaic module including a base, and a resin layer formed of the aqueous dispersion composition on one or both surfaces of the base.

In still another aspect, the present application provides a method of preparing a backsheet for a photovoltaic module, which includes forming a resin layer by coating an aqueous dispersion composition on one or both surfaces of a base and heating the composition.

In yet another aspect, the present application provides a photovoltaic module including a backsheet for a photovoltaic module according to exemplary embodiments of the present application.

BRIEF DESCRIPTION OF THE DRAWINGS

The above and other objects, features and advantages of the present application will become more apparent to those of ordinary skill in the art by describing in detail exemplary embodiments thereof with reference to the adhered drawings, in which:

FIG. 1 is a cross-sectional view of a backsheet for a photovoltaic module according to an exemplary embodiment of the present application;

FIG. 2 is a diagram illustrating a process of preparing a backsheet for a photovoltaic module according to an exemplary embodiment of the present application;

FIG. 3 shows a cross-sectional view of a photovoltaic module according to an exemplary embodiment of the present application; and FIG. 4 is a cross-sectional view of a photovoltaic module according to another exemplary embodiment of the present application.

DETAILED DESCRIPTION OF EXEMPLARY EMBODIMENTS

Hereinafter, exemplary embodiments of the present application will be described in detail. However, the present application is not limited to the embodiments disclosed below, but can be implemented in various forms. The following embodiments are described in order to enable those of ordinary skill in the related art to embody and practice the present application.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present application will be described in detail below. To aid in understanding the present application, like numbers refer to like elements throughout the description of the figures, and the description of the same elements will be not reiterated.

One exemplary embodiment of the present application relates to an aqueous dispersion composition including a fluorine-based polymer, a pigment and an aqueous dispersion binder.

In the aqueous dispersion composition according to exemplary embodiments of the present application, the fluorine-based polymer may serve to enhance durability and weather resistance. In exemplary embodiments of the present application, to prepare an aqueous dispersion composition, a crystalline fluorine-based polymer, not a amorphous fluorine-based polymer, may be used. Although a amorphous fluorine-based polymer has good initial adhesive strength due to a urethane bond formed by a reaction with a crosslinking agent, it may be broken by hydrolysis under high temperature and high pressure, and thus the non-crystalline fluorine-based polymer may be degraded in adhesive reliability more than the crystalline fluorine-based polymer.

A crystallization degree of the crystalline fluorine-based polymer may be 55% or less, 50% or less, 10% to 55%, or 10% to 50%. The term "crystallization degree" used herein refers to a percentage (weight basis) of a crystalline region included in the entire polymer, and may be measured by a known method such as differential scanning calorimetry.

The crystallization degree of the fluorine-based polymer described above may be made by copolymerizing comonomers described above in the preparation of the fluorine-based polymer to decompose a regular atomic arrangement of the fluorine-based polymer, or polymerizing the fluorine-based polymer in the form of a branched polymer.

The fluorine-based polymer may be a non-functionalized pure fluorine-based polymer. The non-functionalized pure fluorine-based polymer may have better weather resistance than functionalized fluorine-based polymers, for example, an acryl-modified fluorine-based polymer, a fluorine-based polymer containing a crosslinkable terminal group, etc. In addition, as a resin layer is formed by coating the aqueous dispersion composition, the resin layer may have an excellent adhesive property to a base film without functionalization of the fluorine-based polymer.

In addition, the fluorine-based polymer is a crystalline polymer not containing a crosslinkable functional group, and may be easily fused with a surface of the base by melting with heat and thus increase an adhesive strength, compared with the fluorine-based amorphous polymer containing a crosslinkable functional group. In exemplary embodiments of the present application, instead of a crystalline polymer not containing a crosslinkable functional group as the fluorine-based polymer, an aqueous dispersion binder may be further included, and thereby processibility in the formation of a coating layer may be ensured.

A kind of the fluorine-based polymer is not particularly limited, and the fluorine-based polymer may be a homopolymer, a copolymer or a mixture thereof including at least one monomer selected from the group consisting of vinylidene fluoride (VDF), vinyl fluoride (VF), tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD) and perfluoro-2-methylene-4-methyl-1,3-dioxolane (PMD) in a polymerized form. Among these, a polymer or copolymer including vinylidene fluoride (VDF) in a polymerized form may be used.

In addition, the fluorine-based polymer may be a copolymer including vinylidene fluoride (VDF) or vinylfluoride (VF) and a comonomer. Here, a kind of the comonomer capable of being included in the fluorine-based copolymer in a copolymerized form is not particularly limited, and may be at least one selected from the group consisting of tetrafluoroethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxole (PDD) and perfluoro-2-methylene-4-methyl-1,3-dioxolane (PMD).

For example, the fluorine-based polymer may be polyvinylidene fluoride (PVDF) or polyvinyl fluoride (PVF) including at least one comonomer selected from the group consisting of tetrafluoroethylene ethylene (TFE), hexafluoropropylene (HFP), chlorotrifluoroethylene (CTFE), trifluoroethylene, hexafluoroisobutylene, perfluorobutylethylene, perfluoro(methylvinylether) (PMVE), perfluoro(ethylvinylether) (PEVE), perfluoro(propylvinylether) (PPVE), perfluoro (hexylvinylether) (PHVE), perfluoro-2,2-dimethyl-1,3-dioxole (PDD) and perfluoro-2-methylene-4-methyl-1,3-dioxolane (PMD) in a polymerized form.

A content of the comonomer included in the fluorine-based copolymer may be, but is not particularly limited to, for example, approximately 0.5 to 50 wt %, 1 to 40 wt %, 7 to 40 wt %, 10 to 30 wt % or 10 to 20 wt % based on a total weight of the fluorine-based polymer. As the content of the comonomer is controlled within the above range, durability and weather resistance may be ensured and effective low-temperature melting may be induced.

The fluorine-based polymer may have a weight average molecular weight of 50,000 to 1,000,000, 100,000 to 700,000, or 300,000 to 500,000, but the present application is not limited thereto. The term "weight average molecular weight" used herein is a conversion value of standard polystyrene measured by gel permeation chromatography (GPC). As the weight average molecular weight of the fluorine-based polymer is controlled within the above range, excellent water dispersity and other physical properties may be ensured.

The fluorine-based polymer may have a melting point of 80 to 175° C., or 120 to 165° C. As the melting point of the fluorine-based polymer is controlled to 80° C. or more, transformation of a backsheet for a photovoltaic module prepared using an aqueous dispersion composition according to exemplary embodiments of the present application in the use thereof may be prevented, and as the melting point of the fluorine-based polymer is controlled to 175° C. or less, as particles of the fluorine-based polymer are melted at a low temperature in the preparation of the backsheet for a photovoltaic module using the aqueous dispersion composition, a uniformly coated appearance may be obtained, and deterioration of a base included in the backsheet for a photovoltaic module may be prevented.

In addition, the fluorine-based polymer may have an average diameter of 10 µm or less. As will be described in a method of the method of preparing a backsheet for a photovoltaic module, when the aqueous dispersion composition is coated on the base, the particles of the fluorine-based polymer may be disposed on the base, and then the particles of the fluorine-based polymer may be melted with heat and changed into a film, thereby forming a resin layer. In this operation, when the average diameter of the fluorine-based polymer is 10 µm or less, a uniform resin layer may be formed. The lower limit of the average diameter of the fluorine-based polymer may be, but is not particularly limited to, 0.1 or 2 µm or more.

A method of preparing the fluorine-based polymer is not particularly limited, and a means generally used in the related art may be employed without limitation. For example, the fluorine-based polymer may be prepared by emulsion polymerization. When the fluorine-based polymer is prepared by emulsion polymerization, the average diameter of the fluorine-based polymer is controlled to 10 µm or less, and the fluorine-based polymer may be prepared to a uniform size. In addition, the fluorine-based polymer prepared by the emulsion method may be dispersed in an aqueous solvent.

In the aqueous dispersion composition, a pigment may serve to provide a color to a layer formed of the aqueous dispersion composition, or enhance other physical properties such as a UV blocking property and reflectivity.

The pigment may be included at 1 to 200 parts by weight with respect to 100 parts by weight of the fluorine-based polymer. When the content of the pigment is less than 1 part by weight, an effect made by addition of the pigment may be significant, and when the content of the pigment is more than 200 parts by weight, the resin layer formed using the aqueous dispersion composition of the present application present application may be easily broken, and scratch resistance may be degraded.

A pigment capable of being used in exemplary embodiments of the present application may be, but is not particularly limited, a metal oxide such as chromium oxide ($Cr_2O_3$), iron oxide ($Fe_2O_3$, $Fe_3O_4$), titanium dioxide, silica or alumina; a black pigment such as carbon black; a complex metal oxide; a metal salt or various kinds of organic pigments. In addition, barium sulfate, barium titanate ($BaTiO_3$), strontium titanate ($SrTiO_3$), calcium titanate ($CaTiO_3$), calcium carbonate, lead titanate ($PbTiO_3$), zinc oxide, zinc sulfate, magnesium oxide or aluminum oxide may be used as a white pigment, but the present application is not limited thereto.

In addition, as the pigment is subjected to surface treatment with an organic compound having hydrophilicity, dispersity in the aqueous dispersion composition may be enhanced and miscibility with other components may be increased.

The aqueous dispersion binder may serve to reinforce a bond between the fluorine-based polymer and the pigment. In detail, when the resin layer is formed using an aqueous dispersion composition according to exemplary embodiments of the present application, the pigment and the fluorine-based polymer are fixed, thereby preventing easy detachment of the pigment from a surface of the resin layer, and thus a chalking phenomenon may be prevented.

Examples of the aqueous dispersion binder capable of being used in exemplary embodiments of the present application may include, but are not limited to, at least one selected from the group consisting of a polyurethane resin, a silane-modified urethane-based resin, a polyacryl resin, a polyurea resin, a polyamide resin, a polyolefin resin, a polyvinylacetate resin, a polyether resin, an alkyde resin, a urethane-acrylate copolymer, a vinyl-urethane copolymer, an ethylene-vinylalcohol copolymer, a silicon-acryl-urethane copolymer, an ethylene-vinylacetate copolymer and an acryl-modified polyester resin.

The aqueous dispersion binder may be included at 5 to 50 parts by weight with respect to 100 parts by weight of the fluorine-based polymer. As the content of the aqueous dispersion binder is controlled within the above range, weather resistance can be maintained when a resin layer is formed. The aqueous dispersion binder may be melted or dispersed in an aqueous solvent, and may have a solid content of 20 to 50%.

The aqueous dispersion composition may further include an aqueous solvent for dispersing the composition components, and such an aqueous solvent may be used as a solvent for dispersing the fluorine-based polymer, the pigment and the aqueous dispersion binder in the aqueous dispersion composition according to exemplary embodiments of the present application. The aqueous solvent may be included at 50 to 2,000 parts by weight with respect to 100 parts by weight of the final total solid content thereof in the composition. As the content of the aqueous solvent is controlled within the above range, dispersion stability of the composition components may be ensured, and a thickness of the resin layer may be easily controlled when the resin layer is formed using the aqueous dispersion composition. The aqueous solvent may be water such as distilled water.

The aqueous dispersion composition according to exemplary embodiments of the present application may enhance dispersity, and may further include a surfactant to enhance wettability with a base when the aqueous dispersion composition is coated on the base. The surfactant may be included at 0.1 to 20 parts by weight, 0.5 to 10 parts by weight, or 1 to 5 parts by weight with respect to 100 parts by weight of the fluorine-based polymer. When the content of the surfactant is less than 0.1 parts by weight, the dispersion and wettability may be degraded, and thus uniform coating of the aqueous dispersion composition on the base may be difficult, and when the content of the surfactant is more than 20 parts by weight, the weather resistance may be degraded due to an excessive surfactant.

As an example of the surfactant capable of being used in exemplary embodiments of the present application, a non-ionic surfactant, a cationic surfactant or an anionic surfactant may be used without limitation, but to have excellent compatibility with the fluorine-based polymer, a fluorine-based surfactant may be used.

The fluorine-based surfactant may be, but is not limited to, an anionic fluorine-based surfactant such as Zonyl FS-62, Zonyl FSA, Zonyl FSE, Zonyl FSJ, Zonyl FSP, Zonyl TBS or Zonyl UR; a non-ionic fluorine-based surfactant such as Zonyl FSO, Zonyl FSO-100, Zonyl FSN or Zonyl FS-300; a cationic fluorine-based surfactant such as Zonyl FSD; or an anionic and cationic fluorine-based surfactant such as Zonyl FSK or BYK340.

Other than the fluorine-based surfactant, a water-soluble polymer such as polyvinylalcohol, polyvinylpyrrolidone, methyl cellulose, ethyl cellulose or a styrene-maleic anhydride copolymer; an anionic surfactant such as sodium oleate or sodium lauryl sulfate; a non-ionic surfactant such as polyoxyethylene alkylether, polyoxyethylene alkyl phenyl ether, polyoxyethylene fatty acid ester, sorbitan fatty acid ester, polyoxy sorbitan fatty acid ester, polyoxyethylene alkylamine or glycerin fatty acid ester; and a cationic surfactant including a quaternary ammonium such as lauryl amine acetate, an alkyl amine salt or lauryltrimethyl ammonium chloride may be used, or a phosphate such as calcium phosphate, magnesium phosphate, aluminum phosphate or zinc phosphate; a pyrophosphoric acid salt such as calcium pyrophosphorylate, magnesium pyrophosphorylate, aluminum pyrophosphorylate or zinc pyrophosphorylate; or an inorganic dispersing agent such as calcium carbonate, magnesium carbonate, calcium hydroxide, magnesium hydroxide, aluminum hydroxide, calcium meta calcium silicate, calcium sulfate, barium sulfate, colloidal silica or fumed silica may be used.

When the fluorine-based polymer is polymerized by emulsion polymerization, the fluorine-based polymer may be previously dispersed in water, and therefore the fluorine-based polymer prepared by emulsion polymerization may be used without using an additional surfactant. Alternatively, when the fluorine-based polymer is present in the form of powder by drying the fluorine-based polymer prepared by emulsion polymerization, the fluorine-based polymer may be dispersed by adding the surfactant.

The aqueous dispersion composition according to exemplary embodiments of the present application may further include a conventional additive such as a UV stabilizer, a thermal stabilizer or a barrier particle without degrading physical properties.

The aqueous dispersion composition according to exemplary embodiments of the present application may be used to form a resin layer on a surface in contact with an outside of a product requiring durability and weather resistance, for example, to prepare a backsheet for a photovoltaic module.

Since the aqueous dispersion composition does not include an organic solvent, it is economical and environmentally friendly. In addition, as an aqueous dispersion binder is further included, a chalking phenomenon caused by detachment of the pigment may be prevented, and thus durability and physical properties may be enhanced.

Another exemplary embodiment of the present application relates to a backsheet for a photovoltaic module including a base, and a resin layer formed of the above-described aqueous dispersion composition on one or both surfaces of the base.

FIG. 1 is a cross-sectional view of a backsheet for a photovoltaic module according to an exemplary embodiment of the present application. As shown in FIG. 1, the backsheet for a photovoltaic module 10 include a base 12; and a resin layer 11 formed on the base 12 and including a fluorine-based polymer.

A specific kind of the base included in the backsheet for a photovoltaic module is not particularly limited, and thus various materials known in the related art may be used as a base. The base may be suitably selected according to a required function and use.

In exemplary embodiments of the present application, the base may be one of various kinds of metal films or polymer films. Here, as a metal film, one composed of a conventional metal component may be used according to its use, and as a polymer film, at least one selected from the group consisting of an acryl film, a polyolefin film, a polyamide film, a polyurethane film and a polyester film may be used, but the present application is not limited thereto. As an example of the polyester film, at least one selected from the group consisting of a polyethyleneterephthalate (PET) film, a polyethylenenaphthalate (PEN) film and a polybutyleneterephthalate (PBT) film may be used, but the present application is not limited thereto. In addition, when necessary, a polyester-based sheet having an enhanced hydrolysis resistance may be used. For example, as the polyester film having a smaller content of an oligomer generated in condensation polymerization is used, the hydrolysis resistance of the backsheet for a photovoltaic module may be enhanced. In addition, when a polyester film is used as a base as described above, known thermal treatment for enhancing hydrolysis resistance may be performed to reduce a water content in polyester and shrinkage, thereby obtaining better hydrolysis resistance.

A thickness of the base may be suitably controlled when necessary without particular limitation, and may be, for example, approximately 50 to 500 nm, or approximately 100 to 300 nm. As the thickness of the base is controlled as described above, electric insulability, a water barrier property, a mechanical characteristic and handleability may be excellently maintained.

A backsheet for a photovoltaic module according to exemplary embodiments of the present application includes a resin layer formed on one or both surfaces of the base, and the resin layer is formed of the above-described aqueous dispersion composition. That is, the resin layer refers to a coating layer formed of an aqueous dispersion composition according to exemplary embodiments of the present application, and may include a melted product of the aqueous dispersion composition. Details about the aqueous dispersion composition are the same as described above, and thus will be omitted below.

The resin layer formed of the aqueous dispersion composition of the backsheet for a photovoltaic module according to exemplary embodiments of the present application may have a thickness of, though not particularly limited to, 1 to 50 μm or 3 to 30 μm. When the thickness of the resin layer is less than 1 μm, the resin layer is too thin to be sufficiently filled with a pigment, and thus a light barrier ability is potentially degraded due to insufficient filling of the pigment, and when the thickness of the resin layer is more than 50 μm, a production cost may be increased.

The resin layer formed of the aqueous dispersion composition may be a coating layer. The term "coating layer" used herein refers to a resin layer formed by coating. In detail, the term "coating layer" refers to the case in which the resin layer including the above-described aqueous dispersion composition is formed by coating an aqueous dispersion composition prepared by dispersing components constituting the resin layer in a solvent, for example, water, not by laminating a sheet formed by casting or extrusion to the base using an adhesive. In FIG. 1, the backsheet for a photovoltaic module 10 according to an exemplary embodiment of the present application includes the base 12, and the resin layer 11 formed on one surface of the base 12. A backsheet for a photovoltaic module (not shown) according to another exemplary embodiment of the present application may include a resin layer on another surface of the base, and therefore the resin layers may be formed on both surfaces of the base.

In exemplary embodiments of the present application, high-frequency spark discharging treatment such as corona or plasma treatment; thermal treatment; flame treatment; treatment with a coupling agent; treatment with a primer; treatment with an anchor agent; or chemical activation using a gas-phase Lewis acid (ex. $BF_3$), sulfuric acid or high-temperature sodium hydroxide may be previously performed on a surface of the base on which the resin layer is formed to further enhance an adhesive strength. Such a method of treating a surface of the base may be performed by a means generally used in the related art.

In addition, in exemplary embodiments of the present application, to enhance a water barrier characteristic, an inorganic oxide depositing layer may be formed on one or both surfaces of the base. A kind of the inorganic oxide is not particularly limited, and thus any inorganic oxide having a water barrier characteristic may be employed without limitation. For example, a silicon oxide or aluminum oxide may be used as an inorganic oxide, but the present application is not limited thereto. A method of forming the inorganic oxide depositing layer to one or both surfaces of the base may be, but is not particularly limited to, deposition generally used in the related art.

When the inorganic oxide depositing layer is formed on one or both surfaces of the base, the inorganic oxide depositing layer is formed on a surface of the base, and then the above-described surface treatment may be performed on the inorganic oxide depositing layer.

Still another exemplary embodiment of the present application relates to a method of preparing a backsheet for a photovoltaic module including forming a resin layer by coating the above-described aqueous dispersion composition on one or both surfaces of the base and heating the coated surface.

FIG. 2 illustrates a process of preparing a backsheet for a photovoltaic module according to an exemplary embodiment of the present application. As shown in FIG. 2, the method of preparing a backsheet for a photovoltaic module may include forming a resin layer by coating the above-described aqueous dispersion composition on one surface of a base and heating the coated surface.

Alternatively, as not shown in FIG. 2, the method of preparing a backsheet for a photovoltaic module may include forming a resin layer on both surfaces of the base by coating the above-described aqueous dispersion composition on both surfaces of a base and heating the coated surfaces.

An aqueous dispersion composition according to exemplary embodiments of the present application may be prepared by dispersing a fluorine-based polymer, a pigment and an aqueous dispersion binder in water, dispersing a fluorine-based polymer, a pigment, an aqueous dispersion binder and a surfactant in water, or dispersing a fluorine-based polymer, a pigment, an aqueous dispersion binder, a surfactant and a conventional additive in water. An operation of dispersing various components in water is not particularly limited, and a dispersing method generally used in the related art may be used without particular limitation. In one example, the aqueous dispersion composition may be prepared by adding various components to water and stirring the resulting solution, but the present application is not limited thereto.

As shown in FIG. 2, when the aqueous dispersion composition is coated on one surface of the base, the fluorine-based polymer particles, the pigment and the aqueous dispersion binder are disposed on a surface of the base, the base coated with the aqueous dispersion composition is heated, and water is evaporated, fluorine-based polymer particles are melted into a film. The aqueous dispersion binder is present in the film of the fluorine-based polymer, and thus a bond between the fluorine-based polymer and the pigment may be reinforced, and detachment of the pigment from the surface of the base may be prevented.

A method of coating the aqueous dispersion composition on a surface of the base may be, but is not particularly limited to, any method capable of forming a uniform resin layer, for example, a known printing method such as offset printing or gravure printing, or a known coating method such as roll coating, knife edge coating, gravure coating or doctor blading. Other than the above methods, various methods known in the related art may be applied.

A method of heating the base coated with the aqueous dispersion composition may be a heating method generally used in the related art without particular limitation. For example, the base coated with the aqueous dispersion composition may be heated using an oven, but the present application is not limited thereto.

The heating temperature may be a melting point of the fluorine-based polymer or more, for example, 150 to 250° C. When the heating temperature is less than 150° C., fluorine-based polymer particles are not melted, and thus the film of the fluorine-based polymer may not be formed, and when the heating temperature is more than 250° C., the base may be deteriorated, thereby degrading physical properties.

A specific kind of the base capable of being used in the method of preparing a backsheet for a photovoltaic module according to exemplary embodiments of the present application is described above, and at least one suitable surface treatment selected from the group consisting of plasma treatment, corona treatment, primer treatment, treatment with an anchor agent, treatment with a coupling agent, deposition and thermal treatment may be performed on one or both surfaces of the base before forming a resin layer. Alternatively, the base may have at least one surface treated layer previously subjected to the surface treatment described above.

As described above, a carboxyl group or a hydroxyl group may be introduced into a surface of the base by performing at least one surface treatment on one or both surfaces of the base. The functional groups may serve to form a chemical bond between the fluorine-based polymer and the aqueous dispersion binder included in the resin layer, and may further enhance an interface bonding strength between the base and the resin layer.

A backsheet for a photovoltaic module prepared by the method of preparing a backsheet for a photovoltaic module may enhance productivity and quality by minimizing transformation of the base due to heat and moisture. Since the backsheet for a photovoltaic module does not use an organic solvent, it may be environmentally friendly and reduce a production cost, and reinforce a bond between the fluorine-based polymer and the pigment through an aqueous dispersion binder, thereby preventing a chalking phenomenon by preventing easy detachment of the pigment from the resin layer.

Yet another exemplary embodiment of the present application relates to a photovoltaic module including the backsheet for a photovoltaic module. A structure of the photovoltaic module is not particularly limited as long as it includes the backsheet for a photovoltaic module, and therefore various structures generally known in the related art may be employed without limitation.

In one exemplary embodiment of the present application, a structure of the photovoltaic module may include a backsheet; a photovoltaic cell or photovoltaic array formed on the backsheet; a light receiving sheet formed on the photovoltaic cell or photovoltaic array; and an encapsulant layer encapsulating the photovoltaic cell or photovoltaic array between the backsheet and the light receiving sheet.

As a backsheet, the backsheet for a photovoltaic module according to exemplary embodiments of the present application described above may be used, and a thickness of the backsheet may be, but is not particularly limited to, for example, 30 to 2,000 µm, 50 to 1,000 µm, or 100 to 600 µm. As the thickness of the backsheet is controlled to 30 to 2,000 µm, a thinner photovoltaic module may be formed, and excellent physical properties such as weather resistance of the photovoltaic module may be maintained.

A specific kind of a photovoltaic cell formed on the backsheet is not particularly limited as long as it is capable of generating a photoelectro-motive force, and therefore a photovoltaic device generally used in the related art may be used. For example, a crystalline silicon photovoltaic cell, for example, using single-crystal silicon or polycrystalline silicon, a single-bonded or tandem-structured amorphous silicon photovoltaic cell, a semiconductor photovoltaic cell including a III-V group compound such as gallium-arsenic (GaAs) or indium-phosphorus (InP), and a semiconductor photovoltaic cell including a II-VI group compound such as cadmium-tellurium (CdTe) or copper-indium-selenide ($CuInSe_2$) may be used, or a thin film polycrystalline silicon photovoltaic cell, a thin film non-crystalline silicon photovoltaic cell and a hybrid photovoltaic cell of thin film crystalline silicon and amorphous silicon may be used.

The photovoltaic cell may form a photovoltaic array (photovoltaic collector) by interconnections connecting between photovoltaic cells. When solar light is radiated to the photovoltaic module, electrons (−) and holes (+) are generated in the photovoltaic cell, thereby flowing a current through an interconnection connecting between photovoltaic cells.

The light receiving sheet formed on the photovoltaic cell or photovoltaic array may protect an inside of the photovoltaic module from wind and rain, external impact or fire, and may serve to ensure long-term reliability when the photovoltaic module is exposed to an external environment. A specific kind of the light receiving sheet is not particularly limited if it has excellent photo transmittance, electric insulability, and mechanical, physical or chemical strength. For example, the light receiving sheet may be a glass plate, a fluorine-based resin sheet, a cyclic polyolefin-based resin sheet, a polycarbonate-based resin sheet, a poly(meth)acryl-based resin sheet, a polyamide-based resin sheet or a polyester-based resin sheet. In one exemplary embodiment of the present application, a glass plate having excellent thermal resistance may be used, but the present application is not limited thereto.

The light receiving sheet may have a thickness of, though not particularly limited to, for example, 0.5 to 10 mm, 1 to 8 mm, or 2 to 5 mm. As the thickness of the light-receiving substrate is controlled within a range of 0.5 to 10 mm, a thinner photovoltaic module may be formed, and excellent physical properties such as long-term reliability of the photovoltaic module may be maintained.

In addition, as the encapsulant layer encapsulating a photovoltaic cell or photovoltaic array in the photovoltaic module, particularly, between the backsheet and the light receiving sheet, an encapsulant generally known in the related art may be employed without limitation.

FIGS. 3 and 4 are cross-sectional views of photovoltaic modules according to various exemplary embodiments of the present application.

FIG. 3 illustrates an example of a wafer-based photovoltaic module 20 including a backsheet for a photovoltaic module according to an exemplary embodiment of the present application. As shown in FIG. 3, the photovoltaic module according to an exemplary embodiment of the present application may include a light receiving sheet 21 capable of being conventionally formed of a ferroelectric (e.g., glass); the backsheet for a photovoltaic module 23 according to exemplary embodiments of the present application; a photovoltaic device 24 of the silicon-based wafer; and an encapsulant layer 22 encapsulating the photovoltaic device 24. Here, the encapsulant layer 22 may include a first layer 22a encapsulating the photovoltaic device 24 and adhered to the light receiving sheet 21, and a second layer 22b encapsulating the photovoltaic device 24 and adhered to the backsheet 23. The first and second layers constituting the encapsulant layer 22 may be formed of a material generally known in the related art as described above.

FIG. 4 is a cross-sectional view of a thin film-type photovoltaic module 30 according to another exemplary embodiment of the present application. As shown in FIG. 4, in the thin film-type photovoltaic module 30, a photovoltaic device 34 may be formed on a light receiving sheet 31 capable of being generally formed of ferroelectrics. The thin film-type photovoltaic device 34 may be conventionally deposited by chemical vapor deposition (CVD). The photovoltaic module 30 in FIG. 4 may include a backsheet 33, an encapsulant layer 32, the photovoltaic device 34 and the light receiving sheet 31, similar to the photovoltaic module 20 of FIG. 3, and the encapsulant layer 32 may be formed in a single layer. Details of the encapsulant layer 32 and the backsheet 33 are described above.

As the method of preparing a photovoltaic module, various methods known to those of ordinary skill in the related art may be employed without particular limitation.

The photovoltaic modules shown in FIGS. 3 and 4 are only examples of various exemplary embodiments of the photovoltaic modules of the present application. In the case of including a backsheet for a photovoltaic module according to the present application, a structure of the module, and a kind and a size of a material constituting the module are not particularly limited, and those generally known in the related art may be employed without limitation.

EXAMPLES

Hereinafter, the present application will be described in detail with reference to Examples according to the present application and Comparative Examples not according to the present application, but the scope of the present application is not limited to Examples to be described below.

Example 1

Preparation of Aqueous Dispersion Composition 100 g of emulsion-polymerized non-functionalized polyvinylidenefluoride (Hylar 561, Solvay, solid content 100%) as a fluorine-based polymer; 50 g of titanium dioxide (Tipure TS6200, Dupont) as a pigment; 20 g of an acryl-modified polyester resin (pesresin A-645 GH, Takamatsu Oils and Fats) as an aqueous dispersion binder; and 1 g of polyvinylalcohol (Polinol P17, OCI Company Ltd.) as a surfactant were dispersed in 400 g of distilled water using a stirrer, thereby preparing an aqueous dispersion composition.

Preparation of Backsheeet for Photovoltaic Module

As shown in FIG. 2, the prepared aqueous dispersion composition was coated on a polyester film (Skyrol SG82, SKC) having a thickness of 250 µm, on which an acryl primer was treated, using a doctor blade and maintained in an oven at 200° C. for 5 minutes to form a resin layer including a melted product of the aqueous dispersion composition, thereby preparing a backsheet for a photovoltaic module.

Example 2

An aqueous dispersion composition and a backsheet for a photovoltaic module were prepared as described in Example 1, except that 20 g of an acryl-modified polyester resin (pesresin A-124S, Takamatsu Oils and Fats, solid content 30%) was used as an aqueous dispersion binder in the operation of preparing an aqueous dispersion composition.

Example 3

An aqueous dispersion composition and a backsheet for a photovoltaic module were prepared as described in Example 1, except that 20 g of a urethane-based aqueous dispersion binder (Takelec WS-5000, Mitsui, solid content 30%) containing a siloxane bond was used as an aqueous dispersion binder in the operation of preparing an aqueous dispersion composition.

Example 4

An aqueous dispersion composition and a backsheet for a photovoltaic module were prepared as described in Example 1, except that 500 g of non-functionalized polyvinylidenefluoride (Hylar Latex 932, Solvay) dispersed in water in an emulsified form was used as a fluorine-based polymer in the operation of preparing an aqueous dispersion composition, instead of 100 g of non-functionalized polyvinylidenefluoride (Hylar 561, Solvay) dispersed in distilled water, and a separate surfactant was not added.

Example 5

An aqueous dispersion composition and a backsheet for a photovoltaic module were prepared as described in Example 1, except that 500 g of a fluorine-based polymer (solid content 20%) in which a copolymer (P(VDF-HFP)) including vinylidene fluoride (VDF) and hexafluoropropylene (HFP) in a polymerized form in a weight ratio of 88:12 was dispersed in water in an emulsified form was used as a fluorine-based polymer in the operation of preparing an aqueous dispersion composition, instead of 100 g of non-functionalized polyvinylidenefluoride (Hylar 561, Solvay, solid content 100%) dispersed in distilled water, and a separate surfactant was not added.

Comparative Example 1

An aqueous dispersion composition and a backsheet for a photovoltaic module were prepared as described in Example 1, except that an acryl-modified polyester resin (pesresin A-645 GH, Takamatsu Oils and Fats) was not used as an aqueous dispersion binder in the operation of preparing an aqueous dispersion composition.

Comparative Example 2

An aqueous dispersion composition and a backsheet for a photovoltaic module were prepared as described in Example 1, except that 500 g of an acryl-modified fluorine-based polymer (solid content 20%) was used as a fluorine-based polymer and a separate surfactant was not added in the operation of preparing an aqueous dispersion composition. The acryl-modified fluorine-based polymer was functionalized with a hydroxyl group by adding 5 g of a 15% ammonium perfluorooctanoate solution in 400 g of distilled water to an 1 L high-pressure reactor, adding 70 g of VDF and 30 g of 2-hydroxyethylmethacrylate (2-HEMA) and maintaining the resulting solution in the reactor at 80° C., and adding 1 g of a 0.5% potassium persulfate solution thereto.

Comparative Example 3

An aqueous dispersion composition and a backsheet for a photovoltaic module were prepared as described in Example 1, except that 167 g of Zeffle GK-570 (Daikin Industries, solid content 60%), which was a copolymer of a amorphous tetrafluoroethylene (TFE) and hydroxyl group-substituted ethylene, was used as a fluorine-based polymer in the operation of preparing an aqueous dispersion composition.

Comparative Example 4

An aqueous dispersion composition and a backsheet for a photovoltaic module were prepared as described in Example 1, except that 1 g of an acryl-modified polyester resin (pesresin A-645 GH, Takamatsu Oils and Fats) was used as an aqueous dispersion binder in the operation of preparing an aqueous dispersion composition.

Reference Example 1

An aqueous dispersion composition and a backsheet for a photovoltaic module were prepared as described in Example 1, except that titanium dioxide (Tipure TS6200, Dupont) as a pigment and an acryl-modified polyester resin (pesresin A-645 GH, Takamatsu Oils and Fats) as an aqueous dispersion binder were not used in the operation of preparing an aqueous dispersion composition.

Compositions of the aqueous dispersion compositions prepared in Examples and Comparative Examples are listed in Tables 1 and 2.

TABLE 1

| Components | Example 1 | Example 2 | Example 3 | Example 4 | Example 5 |
|---|---|---|---|---|---|
| fluorine-based polymer (content) | PVDF (100 g) | PVDF (100 g) | PVDF (100 g) | PVDF emulsion (solid content 20%, 500 g) | P(VDF-HFP) (solid content 20%, 500 g) |
| pigment (content) | titanium dioxide (50 g) | titanium dioxide (50 g) | titanium dioxide (50 g) | titanium dioxide (50 g) | titanium dioxide (50 g) |
| aqueous dispersion binder (content) | A645 GH (solid content 30%, 20 g) | A124S (solid content 30%, 20 g) | WS-5000 (solid content 30%, 20 g) | A645 GH (solid content 30%, 20 g) | A645 GH (solid content 30%, 20 g) |
| surfactant (content) | PVA (1 g) | PVA (1 g) | PVA (1 g) | — | — |
| solvent (content) | distilled water (400 g) | distilled water (400 g) | distilled water (400 g) | — | — |

PVDF: polyvinylidenefluoride
A645 GH: acryl-modified polyester resin (Takamatsu Oils and Fats)
A124S: acryl-modified polyester resin (Takamatsu Oils and Fats)
WS-5000: urethane-based aqueous dispersion binder (Mitsui)
PVA: polyvinylalcohol (Polinol P17, OCI Company Ltd.)

TABLE 2

| Components | Comparative Example 1 | Comparative Example 2 | Comparative Example 3 | Comparative Example 4 | Reference Example 1 |
|---|---|---|---|---|---|
| fluorine-based polymer (content) | PVDF (100 g) | acryl-modified fluorine-based polymer (solid content 20%, 100 g) | GK-570 (solid content 60%, 167 g) | PVDF (100 g) | PVDF (100 g) |
| pigment (content) | titanium dioxide (50 g) | titanium dioxide (50 g) | titanium dioxide (50 g) | titanium dioxide (50 g) | — |
| aqueous dispersion binder (content) | — | A645 GH (solid content 30%, 20 g) | A645 GH (solid content 30%, 20 g) | A645 GH (solid content 30%, 1 g) | — |
| surfactant (content) | PVA (1 g) | — | PVA (1 g) | PVA (1 g) | PVA (1 g) |
| solvent (content) | distilled water (400 g) | — | distilled water (400 g) | distilled water (400 g) | distilled water (400 g) |

PVDF: polyvinylidenefluoride
GK-570: a copolymer of a amorphous tetrafluoroethylene (TFE) and hydroxyl group-substituted ethylene
A645 GH: acryl-modified polyester resin (Takamatsu Oils and Fats)
PVA: polyvinylalcohol (Polinol P17, OCI Company Ltd.)

Physical properties of the backsheets for a photovoltaic module prepared in Examples, Comparative Examples and Reference Example were measured by methods to be described below.

Experimental Example 1

Measurement of Cross-Hatch Adhesive Strength

A cross-cut test was performed according to the standard for a cross-cut test, that is, a specification of ASTM D3002/D3359. Specifically, a specimen was cut at 1 mm intervals in horizontal and vertical directions by 11 rows using a knife, thereby forming a grid of 100 squares having length and width of 1 mm×1 mm. Afterward, as a CT-24 adhesive tape produced by Nichiban was attached to the grid-formed surface and then detached, a state of the surface detached along with the tape was measured and evaluated according to the following criteria.
<Criteria for Evaluating Cross-Hatch Adhesive Strength>
5B: no detached region
4B: area of detached region is less than 5% based on total surface area
3B: area of detached region is from 5% to 15% based on total surface area
2B: area of detached region is from over 15% to 35% based on total surface area
1B: area of detached region is from over 35% to 65% based on total surface area
0B: area of detached region is over 65% based on total surface area Experimental Example 2

Pressure Cooker Test (PCT)

The change in adhesive strength was observed after each of the backsheets for a photovoltaic module prepared in Examples and Comparative Examples in which both surfaces of a base were coated with a fluoropolymer was left in an oven maintaining conditions of 2 atm, 121° C. and 100% R.H. for 25, 50 or 75 hours.

Experimental Example 3

Measurement of Occurrence of Chalking

In the measurement of the cross-hatch adhesive strength, whether or not the pigment was attached to the adhesive tape was measured.

<Occurrence of Chalking>
Chalking occurred: the pigment was attached to the adhesive tape
Chalking did not occur: the pigment was not attached to the adhesive tape
Physical properties of the backsheets for a photovoltaic module prepared in Examples, Comparative Examples and Reference Example are listed in Table 3.

TABLE 3

| | Adhesive Strength | | | | |
|---|---|---|---|---|---|
| | 0 hours after PCT | 25 hours after PCT | 50 hours after PCT | 75 hours after PCT | Occurrence of Chalking |
| Example 1 | 5 B | 5 B | 5 B | 5 B | Chalking did not occur |
| Example 2 | 5 B | 5 B | 5 B | 5 B | Chalking did not occur |
| Example 3 | 5 B | 5 B | 5 B | 5 B | Chalking did not occur |
| Example 4 | 5 B | 5 B | 5 B | 5 B | Chalking did not occur |
| Example 5 | 5 B | 5 B | 5 B | 5 B | Chalking did not occur |
| Comparative Example 1 | 5 B | 5 B | 5 B | 5 B | Chalking occurred |
| Comparative Example 2 | 5 B | 5 B | 3 B | 0 B | Chalking occurred |
| Comparative Example 3 | 5 B | 0 B | 0 B | 0 B | Chalking occurred |
| Comparative Example 4 | 5 B | 5 B | 5 B | 5 B | Chalking occurred |
| Reference Example 1 | 5 B | 5 B | 5 B | 5 B | Chalking did not occur |

As shown in Table 3, it was confirmed that all of Examples 1 to 5, Comparative Examples 1 to 4 and Reference Example 1 exhibited excellent adhesive strengths.

However, in Examples 1 to 5, since the resin layer of the backsheet included the fluorine-based polymer, pigment and aqueous dispersion binder, chalking caused by the pigment did not occur. Meanwhile, in Comparative Example 1, since the resin layer of the backsheet did not include the aqueous dispersion binder, the pigment projected on a surface of the resin layer was easily detached, and thus the chalking occurred. In addition, in Comparative Examples 2 and 3, since the adhesive strength was degraded after PCT and the pigment projected on a surface of the resin was easily detached, the chalking occurred. In Comparative Example 4, since an amount of aqueous dispersion binder was insufficient, the pigment projected on a surface of the resin was easily detached, and thus the chalking occurred.

In Reference Example 1, since the resin layer of the backsheet did not include the aqueous dispersion binder and pigment, the chalking phenomenon by the pigment did not occur. However, since the resin layer did not include the pigment, a UV blocking property and reflectivity were not degraded, and thus durability and weather resistance could be degraded.

That is, since the aqueous dispersion composition of the present application includes a fluorine-based polymer, a pigment, an aqueous dispersion binder and water, when the backsheet for a photovoltaic module was prepared using these, the chalking phenomenon could be prevented due to the reinforcement of the bond between the fluorine-based polymer and the pigment by the aqueous dispersion binder, and excellent physical properties such as the durability and the weather resistance could be maintained. In addition, since the organic solvent was not included, it is environmentally friendly and economical.

According to exemplary embodiments of the present application, the aqueous dispersion composition, more particularly, an aqueous dispersion composition for a photovoltaic module, is provided. Since the aqueous dispersion composition includes a fluorine-based polymer, a pigment and an aqueous dispersion binder, in the preparation of a backsheet for a photovoltaic module using the aqueous dispersion composition, a toxic organic solvent is not used, and thus the preparation is environmentally friendly, compared with a preparation method using a conventional organic solvent. In addition, when the aqueous dispersion composition is used alone, a chalking phenomenon in which a pigment projected on a surface of the backsheet is easily detached can occur, but as an aqueous dispersion binder can be further included, the chalking phenomenon can be prevented, and thus productivity and quality can all be enhanced.

While the invention has been shown and described with reference to certain exemplary embodiments thereof, it will be understood by those skilled in the art that various changes in form and details may be made therein without departing from the scope of the invention as defined by the appended claims.

What is claimed is:
1. An aqueous dispersion composition, comprising:
a fluorine-based polymer which is the only fluorine-based polymer present in the aqueous dispersion composition, wherein the fluorine-based polymer consists of a crystalline fluorine-based polymer of which the crystallization degree is 10% to 55% having an average diameter of 2 to 10 μm,
a pigment which is titanium dioxide,
a surfactant, and
an aqueous dispersion binder which is at least one selected from the group consisting of a polyurethane resin, a silane-modified urethane-based resin, and an acryl-modified polyester resin, and which is included in an amount of 5 to 50 parts by weight with respect to 100 parts by weight of the fluorine-based polymer and the aqueous dispersion binder is melted or dispersed in an aqueous solvent and the aqueous dispersion binder has a solid content of from 20% to 50%,
wherein, in the aqueous dispersion composition, the fluorine-based polymer, the pigment, the surfactant and the aqueous dispersion binder are dispersed in an aqueous solvent,
wherein the surfactant is selected from the group consisting of a fluorine-based surfactant, a polyvinylalcohol, a polyvinylpoyrrolidone, a methyl cellulose, an ethyl cellulose, a styrene-maleic anhydride copolymer, sodium oleate, a sorbitan fatty acid ester, a polyoxy sorbitan fatty acid ester, a polyoxyethylene alkylamine, a glycerin fatty acid ester, a quaternary ammonium, a phosphate, a pyrophosphoric acid salt, and an inorganic dispersing agent, and
wherein the aqueous dispersion composition has no detachment region according to ASTM D3002/D3359 standards on a CT-24 adhesive tape, no change in adhesive strength to the tape after 75 hours at 2 atm and 121° C., and the pigment does not attach to the adhesive tape.

2. The composition according to claim 1, wherein the fluorine-based polymer does not contain a crosslinkable functional group.

3. The composition according to claim 1, wherein the fluorine-based polymer includes polyvinylidene fluoride (PVDF) or polyvinyl fluoride (PVF) including at least one comonomer selected from the group consisting of tetrafluoroethylene (TFE), hexafluoropropylene (HFP), chlorotrifluoroethylene (CTFE), trifluoroethylene, hexafluoroisobutylene, perfluorobutylene, perfluoro(methylvinylether) (PMVE), perfluoro(ethylvinylether) (PEVE), perfluoro(propylvinylether) (PPVE), perfluoro(hexylvinylether) (PHVE), perfluoro-2,2-dimethyl-1,3-dioxide (PDD) and perfluoro-2-methylene-4-methyl-1,3-dioxolane (PMD).

4. The composition according to claim 3, wherein the comonomer included in the fluorine-based copolymer has a content of 0.5 to 50 wt % based on a total weight of the fluorine-based copolymer.

5. The composition according to claim 1, wherein the fluorine-based polymer has a weight average molecular weight of 50,000 to 1,000,000.

6. The composition according to claim 1, wherein the fluorine-based polymer has a melting point of 80 to 175° C.

7. The composition according to claim 1, wherein the pigment is included at 1 to 200 parts by weight with respect to 100 parts by weight of the fluorine-based polymer.

8. The composition according to claim 1, wherein the aqueous dispersion composition includes the fluorine-based polymer, the pigment and the aqueous dispersion binder, which are dispersed in an aqueous solvent, and the aqueous solvent is included at 50 to 2,000 parts by weight with respect to 100 parts by weight of a solid content of the composition.

9. The composition according to claim 1, wherein the surfactant is included at 0.1 to 20 parts by weight with respect to 100 parts by weight of the fluorine-based polymer.

10. A backsheet for a photovoltaic module, comprising:
a base; and
a resin layer formed on one or both surfaces of the base, and formed of the aqueous dispersion composition according to claim 1.

11. The backsheet according to claim 10, wherein the base is a metal film or a polymer film.

12. The backsheet according to claim 10, wherein the base has a thickness of 50 to 500 μm.

13. The backsheet according to claim 10, wherein the resin layer includes a melted product of an aqueous dispersion composition.

14. The backsheet according to claim 10, wherein the resin layer has a thickness of 1 to 50 μm.

15. A photovoltaic module comprising the backsheet for a photovoltaic module according to claim 10.

16. A method of preparing a backsheet for a photovoltaic module, comprising:
   forming a resin layer by coating the aqueous dispersion composition according to claim 1 and heating the coated surface.

17. The method according to claim 16, wherein the heating temperature is 150 to 250° C.

* * * * *